United States Patent [19]
Summerfelt

[11] Patent Number: 6,083,812
[45] Date of Patent: *Jul. 4, 2000

[54] HETEROEPITAXY BY LARGE SURFACE STEPS

[75] Inventor: Scott R. Summerfelt, Dallas, Tex.

[73] Assignee: Texas Instruments Incorporated, Dallas, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/012,556

[22] Filed: Feb. 2, 1993

[51] Int. Cl.$^7$ .................................................. H01L 21/20
[52] U.S. Cl. ........................ 438/481; 438/497; 438/503; 438/931; 117/950; 117/951; 117/952
[58] Field of Search ................................. 437/133, 126; 148/DIG. 65, DIG. 113; 156/DIG. 99; 438/478, 479, 481, 497, 503, 931; 117/950, 951, 952

[56] References Cited

U.S. PATENT DOCUMENTS

| | | | |
|---|---|---|---|
| 4,855,249 | 8/1989 | Akasaki et al. | 437/133 |
| 5,122,845 | 6/1992 | Manabe et al. | 257/76 |

OTHER PUBLICATIONS

D.W. Susnitzky, et al. "Surface Morphology of Heat–Treated Ceramic Thin Films" J. Am. Ceram. Soc. 75 (9) pp. 2463–2478 (1992).

Lisa A. Tietz et al. "The Effect of Substrate Orientation on the Chemical Vapor Deposition Growth of $\alpha Fe_2 O_3$ on $\alpha-Al_2O_3$" Philosophical Magazine A, vol. 65, No. 2 pp. 439–460.

R.T. Smith, et al. "Influence of Sapphire Substrate Orientation on SOS Crystalline Quality and SOS/MOS Transistor Mobility" J: Crystal Growth 58 (1982) pp. 61–72.

M. Grant Norton et al. "Observation of the Early Stages of Growth of Superconducting Thin Films by Transmission Electron Microscopy" Appl. Phys. Lett 55 (22), Nov. 27, 1989 pp. 2348–2350.

Lisa A. Tietz, et al. "Early Stages of the Heteroepitactic Growth of Hematite on (0001) $Al_2 O_3$ byTtransmission Electron Microscopy" Appl: Phys. Lett 55(12), pp. 1202–1204 Sep. 18, 1989.

D.W. Susnitzky et al. "The Structure of Surface Steps in Low–Index Planes of Oxides" Mat. Res. Soc. Symp. vol. 60 pp. 219–226.

R.W. Bartlett, et al. "Epitaxial Growth of B–Silicon Carbide" mat. Res. Bull. vol. 4, pp. 5341–5354 (1969) Pergamom Press, Inc.

I. Akasaki, et al. "Effects of AlN Buffer Layer on Crystallographic Structure and on Electrical and Optical Properties of GaN and $Ga_{1-x}Al_xN(0 \leqq x \leqq 0.4)$ Films Grown on Sapphire Substrate by Movpe" J. of Crystal Growth 98 (1989) pp. 209–219.

M. Grant Norton, et al. "Surface preparation for the heteroepitactic growth of ceramic thin films" Appl. Phys Lett 56(22), May 28, 1990 pp. 2246–2248.

(List continued on next page.)

Primary Examiner—Charles Bowers
Assistant Examiner—Keith Christianson
Attorney, Agent, or Firm—W. Daniel Swayze, Jr.; Wade James Brady, III; Richard L. Donaldson

[57] ABSTRACT

A method for heteroepitaxial growth and the device wherein a single crystal ceramic substrate, preferably Y stabilized zirconia, $MgAl_2O_4$, $Al_2O_3$, 3C—SiC, 6H—SiC or MgO is cut and polished at from about 1.0 to about 10 degrees off axis to produce a substantially flat surface. The atoms on the surface are redistributed on the surface to produce surface steps of at least three lattice spacings. An optional epitaxially grown ceramic buffer layer, preferably AlN or GaN, is then formed on the substrate. Then a layer of semiconductor, preferably SiC, AlN when the buffer layer is used and is not AlN or GaN is grown over the substrate and buffer layer, if used.

13 Claims, 7 Drawing Sheets

OTHER PUBLICATIONS

Z. Sitar, et al. "Growth of AlN/6aN layered structures by gas source molecular–beam epitaxy" J. Vac. Sci. Technology B8(2), Mar./Apr. 1990 pp. 316–322.

S. Nakamora, et al. "High–Power GaN P–N Junction Blue–Light–Emitting Diodes" Japanese J. of Appl. Phys. vol. 30, No. 12A, Dec. 1991, pp. L1998–2001.

T. Detchprohm, et al. "Hydride vapor phase epitaxial growth of a high quality GaN film using ZnO buffer layer" Appl. Phys. Lett. 61 pp. 2689–2690 (1982).

V.V. Luchinin, et al. "Heteroepituxial composite with the rare ZH polytype of silicon carbide on an aluminun–nitrade–sapphire insulating substrate" Sov. Tech. Phys. Lett 10(7), Jul. 1984 pp. 366–367.

K. Hiramatsu et al. "MOVPE growth of GaN on a misoriented Sapphire Substrate" Journal of Crystal Growth 107(1991) pp. 509–512.

H.S. Kong, et al. "Chemical vapor deposition and characterization of 6H–SiC thin films on off–axis 6H–SiC Substrates" J. Appl. Phys 64(5) Sep. 1, 1988 pp. 2672–2679.

MISFIT BETWEEN AIN AND (0001) SAPPHIRE = 12%

HETEROEPITAXY BY LARGE SURFACE STEPS

BACKGROUND OF THE INVENTION

1. Field of the Invention

This invention relates to heteroepitaxial growth with minimization of the effect of crystallographic misfits.

2. Brief Description of the Prior Art

Heteroepitaxy on substrates with large misfits results in a large number of defects, such as threading dislocations. Therefore, for materials that require a low defect density, only substrates with a small misfit can be used for heteroepitaxy. This requirement severely limits the choice of substrates.

Heteroepitaxy allows different materials to be combined and allows properties of each to be simultaneously exploited. Some commercially important examples of heteroepitaxy include germanium or gallium arsenide on silicon, or silicon on sapphire. Heteroepitaxy generally generates defects and, in general, the number of defects is dependent upon the magnitude of misfit between the film and the substrate. The properties of semiconductors generally degrade rapidly with increasing density of defects, therefore only low misfit substrates can be used to grow semiconductors.

Silicon carbide is a semiconductor material that displays great potential for high temperature and high power microwave properties. Homoepitaxy on 6H—SiC (a hexagonal crystal structure) substrates has previously been the only way to make good quality SiC for devices. Heteroepitaxy of 3C—SiC (a cubic crystal structure) on Si has been successful but the defect density is too large for device applications and the Si substrate has many other serious limitations in terms of device performance, such as low resistivity and low melting point (compared to standard SiC growth temperatures). The mismatch between Si and SiC is about 20%. Sapphire ($Al_2O_3$) is another substrate that has much better properties than Si. The misfit between sapphire and SiC is still very large, about 13%. Aluminum nitride and gallium nitride have similar structures and lattice parameters to SiC and these materials grow epitaxially on sapphire, but again with a large density of threading dislocations. The microstructure of gallium nitride on sapphire, in general, consists of regions of very low density of threading dislocations surrounded by areas of very high density of threading dislocations (See Z. Sitar et al., "Growth of AlN/GaN Layered Structures by Gas Source Molecular-beam Epitaxy", *Journal of Vacuum Science Technology* (1990). This microstructure results from the initial three-dimensional growth of the film. The crystallographic axis of each island is rotated slightly with respect to the substrate. When these islands grow together and form a continuous film, the misalignment between the island and the substrate becomes misalignment between neighboring grains with low angle grain boundaries to accommodate this misalignment. The degree of misalignment is primarily related to the misfit, but growth conditions also influence the final threading dislocation density greatly.

The best quality gallium nitride on sapphire has been achieved by a two step growth procedure (See S. Nakamura et al., "High-power GaN P—N Junction Blue-light-emitting Diodes", *Japanese Journal of Applied Physics*, 30, pp. L1998–2001 (1991) and H. Amano Akasaki et al., "Effects of AlN Buffer Layer on Crystallographic Structure and on Electrical and Optical Properties of GaN and $Ga_{1-x}Al_xN$ ($0<x\leq0.4$) Films Grown on Sapphire Substrate by MOVPE", *Journal of Crystal Growth*, 98, pp. 209–219 (1989)). The first step is to anneal the substrate at 1050° C. in order to "clean" the sapphire. As will be pointed out below, the initial anneal is extremely important for a different reason. Growth of a thin GaN or AlN buffer layer occurs at a low temperature (600–650° C.). The low temperature results in a very high density of islands and hence a rapid transformation from 3-dimensional to 2-dimensional growth. The growth temperature is then raised to a high temperature and a thick GaN layer is grown. The top GaN has good crystalline quality and a much lower threading dislocation density than those reported by other growth techniques. The high temperature growth results in the gradual reduction and even cancellation of defects which were formed in the initial buffer layer. The primary disadvantage of this technique is that, while it improves the defect density, there still remains a very high level of defects.

While the large misfit between substrate and film results in a very large misfit dislocation density, these dislocations are localized near the interface and hence do not degrade the performance of the devices. The "bad" dislocations are the threading dislocations. In large misfit systems, it is much more difficult to form threading dislocations inside islands because the critical thickness is so small that the dislocations are introduced almost immediately. This observation helps to explain the microstructure of GaN on sapphire. Threading dislocations in low misfit systems generally form by interactions between misfit dislocations while they are moving to accommodate the stress during growth. This interaction happens after the film has started to grow two-dimensionally. What is needed is a method to align the islands to the substrates such that the misalignment between neighboring islands is much smaller. It is the misalignment between islands which generally results in the large defect density in large misfit heteroepitaxy and not the misfit dislocations themselves.

SUMMARY OF THE INVENTION

In accordance with the present invention the formation of large surface steps is used (larger than one or two lattice spacing) to help align the islands growing on the film. The reduction in the misalignment results in a lower defect density. This idea is similar to graphoepitaxy. The simplest implementation of graphoepitaxy involves patterning an amorphous substrate with ridges or lines. The film will sometimes grow epitaxially on the substrate where the alignment is controlled by the surface relief and not by the crystal structure of the substrate.

The surface steps are typically formed by growth on a vicinal surface which has been heat treated to form a periodic array of surface steps. The surface step height can in general be controlled by the time and temperature of the heat treatment and the spacing and type of surface steps can be controlled by the angle away from the perfect substrate orientation and tilts toward the major crystallographic planes.

Recent research in ceramic surfaces has shown that ceramics frequently form surface steps which are much larger than two lattice spacings when annealed at high temperatures (See David W. Susnitzky, Ph.D. Thesis, Cornell University (1988) and David W. Susnitzky et al., "The Structure of Surface Steps on Low-Index Planes of Oxides", *Material Resource Society Symposium Proceedings*, 60, pp. 219–226 (1986)). This type of behavior is very different from that observed in traditional semiconductors such as silicon. The Si (001) surface is known to form surface steps which are one or two lattice spacings high. There has been no observation of larger surface steps, even when heated to near the melting point. Ceramic surfaces have not been studied nearly as much as semiconductor and metal surfaces and the formation of large surface steps has only been recently reported and primarily in the ceramics literature and not the surface science literature. These surface steps facet parallel to low energy planes and are frequently multiple unit cells tall.

These ideas are used herein to improve the crystal quality of Sic, AlN or GaN on sapphire. SiC is a desirable semiconductor material for high temperature, high power semiconductors. There is great interest in SiC for microwave applications, but the SiC substrates are now small (<1 inch diameter), expensive (>$5000 per square inch) and are not very insulating (>2,000 Ω-cm necessary for microwave devices). Sapphire substrates are readily available in large sizes (<8 inch diameter), relatively inexpensive (<$50 per square inch) and very insulating (>$10^{14}$ Ω-cm). The problem is that the lattice misfit between sapphire and SiC is about 13%. The heteroepitaxy of SiC on sapphire has not been extensively studied but the heteroepitaxy of AlN and GaN on sapphire has been extensively studied. AlN and GaN are structurally very similar to SiC with very little lattice misfit (misfit between AlN and SiC is <1%). AlN and GaN have been successfully grown on SiC with very good crystal quality. This implies that the growth of SiC on sapphire is very similar to that of GaN or AlN on sapphire.

In accordance with the present invention, a semiconductor device is fabricated using using heteroepitaxy on compatable substrates with a large misfit. Specific examples of semiconductor materials include SiC, GaN, InN and alloys of these materials and, with AlN for example, SiC—AlN, GaN—AlN, GaN—InN. Other semiconductors which benefit from this technique include diamond, cubic-BN and such traditional semiconductors as GaAs and other group III–V compounds, CdTe and other group II–VI compounds as well as Si and Ge.

One of the principle advantages of the present invention is in allowing a much larger range of suitable substrates. Homoepitaxy will always provide better cyrstalline quality, so this technique will not be used unless there is some advantage in choosing an alternate substrate. The substrate must satisfy numerous requirements which can vary, depending upon the material and the device to be made. These requirements include substrate cost and availability in suitable wafer sizes, strength and hardness, thermal expansion coefficient, thermal conductivity, transparency, resistivity, chemical reactivity, vapor pressure and melting and/or sublimation temperature. In addition the substrate must have structural compatibility with the semiconductor or with a suitable buffer layer(s) to the semiconductor as well as be capable of forming large surface steps (larger than 2 lattice spacings). For example, SiC substrates are available but are very expensive and have a low resistivity. The low resistivity of the substrates is detrimental for microwave devices although not for high temperature and/or high voltage SiC devices. Sapphire substrates are suitable because of their very high melting point, low chemical reactivity, high thermal conductivity, high resistivity, low cost (compared to SiC substrates) and availability as large wafers. Sapphire is also structurally compatible with SiC and forms an appropriate surface. Most ceramics form an appropriate surface structure and hence the major requirement is being structurally compatible with the semiconductor or its buffer layer(s).

In general, structural compatibility requires that the substrate be capable of providing some type of structural relationship with the substrate. Structural relationships can be fairly exotic such as the case of (001) Si on (001) spinel ($MgAl_2O_4$) in which three Si lattice spacings almost match two spinel lattice spacings. Another example is the heteroepitaxy of (001) Si on the rhombahedral plane of sapphire in which a cubic semiconductor heteroepitaxially grows on a hexagonal substrate whose surface is pseudo-cubic. In the case of SiC on sapphire, the lattice misfit between the basal plane SiC and basal plane of sapphire is approximately 12%. This lattice misfit is such that SiC does grow heteroepitaxially on the sapphire but with a large number of threading dislocations. Substrates with a very small misfit (less than 1–2%) do not require surface steps since the small misfit will allow semiconductors with good crystal quality to be grown.

In order to use surface steps to improve heteroepitaxy, it is necessary to form surface steps which have a compatible symmetry to the substrate. For example, the surface steps on basal plane sapphire have three fold symmetry. This surface is therefore structurally compatible with (111) cubic 3C SiC as well as the basal plane of rhodahedral or hexagonal polytypes of SiC. Another theoretically compatible structure is the growth of a cubic material on the {001} surface of an orthorhombic substrate whose lattice parameters are nearly cubic if the surface steps are formed along {001} type planes. One example of a surface with incompatible symmetry is the heteroepitaxy of (001) Si on the rhombahedral plane of sapphire. The sapphire forms surface steps on three different planes whose symmetry is incompatible with a cubic symmetry. Therefore, the heteroepitaxy of the Si will not be significantly improved using surface steps because, while the lattice spacings of the sapphire surface are pseudo-cubic, the structure of the sapphire surface steps is not.

The first step in fabricating devices requires manufacturing the correct type and size of surface steps on the compatible substrate. A single crystal ceramic substrate is cut and polished at least 1° off axis and up to about 10° off axis to produce a flat surface. The atoms are then redistributed on the surface to produce steps of greater than three lattice spacings and up to about 1000 lattice spacings. The orientation of the surface (amount of direction of tilt) along with the amount and type of atom redistribution controls the type and size of the surface steps. The redistribution can occur by many processes including, for example, anisotropic etching, annealing at high temperatures and annealing at lower temperatures with enhanced surface diffusion rates because of ion, electron or photon flux.

An optional second step is the deposition of one or more buffer layers. In general, the purpose of the buffer layer(s) is to improve the heteroepitaxy. The buffer layer(s) can be used to gradually match the lattice parameters, crystal structures or thermal expansion coefficients. In the specific case of the deposition of SiC or GaN on sapphire, AlN or ZnO has been found to be a good buffer layer (see T. Detchprohm et al., "Hydride vapor phase epitaxial growth of a high quality GaN film using a ZnO buffer layer", *Applied Physics Letters*, 61, pp 2688–90 (1982)) for the case of ZnO). In the case of SiC on sapphire, the AlN has a much more similar lattice parameter to the SiC than does sapphire. In addition, chemical vapor deposition (CVD) of SiC on sapphire has been, in general, unsucessful because the surface of the sapphire becomes reduced at the high temperatures (>1500° C.) and reducing and corrosive atmospheres frequently used by SiC CVD (see R. W. Bartlett et al., "Epitaxial Growth of β-Silicon Carbide" *Mat. Res. Bull.*, Vol. 4, pp. S 341–S354, 1969, Pergamon Press). Another advantage of the growth of SiC on AlN is the possiblity of forming the 2H polytype of SiC (see V. V. Luchinin et al, "Heteroepitaxial composite with the rare 2H polytype of silicon carbide on an aluminum-nitride-sapphire insulating substrate", Sov. Tech. Phys. Lett, 10(7), July 1984, pp 366–7). AlN has the 2H or wurtzite structure. This polytype should have improved electron and hole mobilities compared to the typical 6H—SiC polytype.

The deposition technique and/or conditions are, in general, optimized to provide the lowest defect density at the surface of the buffer layer. In addition, the buffer layer should be fairly flat, not crack and must be manufacturable and cost effective.

The deposition of the semiconductor is then performed directly on the stepped surface or on the top buffer layer. The deposition techniques and conditions are in general optimized to provide the lowest defect density or best electrical properties in the active area of the device with the correct doping profile. Multiple depositions of the semiconductor might be necessary on planar or processed substrates. The type of device will determine the dopant profiles and processing steps and are hence not a part of this invention.

BRIEF DESCRIPTION OF THE DRAWINGS

FIG. 3b is a perspective view of the surface of FIG. 3a;

FIG. 7b is a perspective view of the of the diagram of FIG. 7a;

DESCRIPTION OF THE PREFERRED EMBODIMENT

Figure 1:
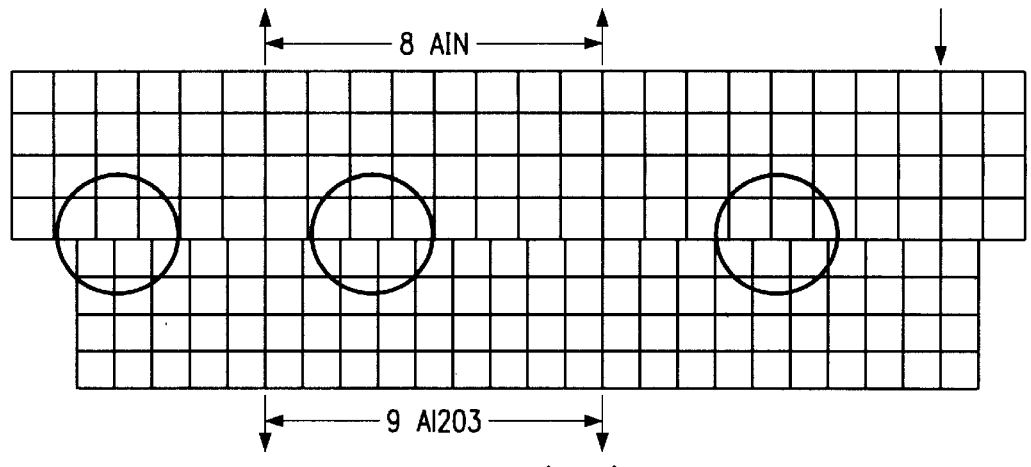
FIG. 1 is a schematic diagram illustrating the lattice misfit between basal plane (0001) sapphire and AlN.

In order to illustrate these ideas, several schematic diagrams and figures are provided. FIG. 1 is a schematic diagram illustrating the lattice misfit between basal plane (0001) sapphire and AlN. The lattice misfit between the basal plane of AlN and sapphire is 12% which roughly corresponds to 8 AlN planes matching 9 sapphire planes. Therefore there will be a misfit dislocation represented by a circle in FIG. 1 approximately every 9 sapphire lattice spacings. Unlike low misfit systems, these misfit dislocations will form even when the film or islands are less than 1 nm thick. Because these dislocations form almost immediately, there will be little interaction between dislocations and the density of threading dislocations inside an island will be small. This large lattice misfit generally results in a large misorientation between the substrate and the film during growth.

Figure 2:
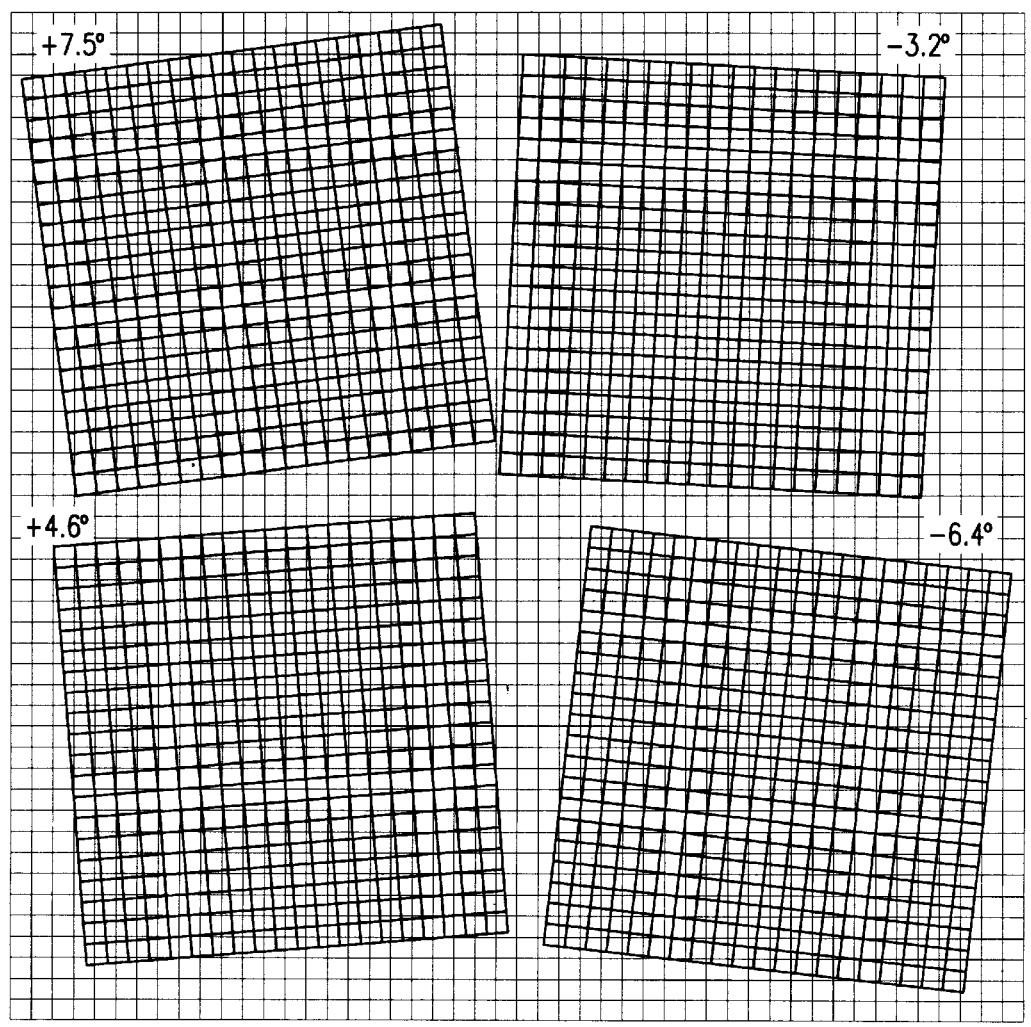
FIG. 2 illustrates how small rotation of islands with respect to the substrate will result in rotations between grains and the subsequent formation of misfit dislocations between them.

FIG. 2 illustrates how small rotation of islands with respect to the substrate will result in rotations between grains and the subsequent formation of misfit dislocations between them. The large lattice misfit therefore produces threading dislocations as a result of the misorientation between islands and not because of the misfit which is accommodated by the misfit dislocations. The goal is therefore to somehow provide something other than the lattice of the substrate to align the islands.

Figure 3A:
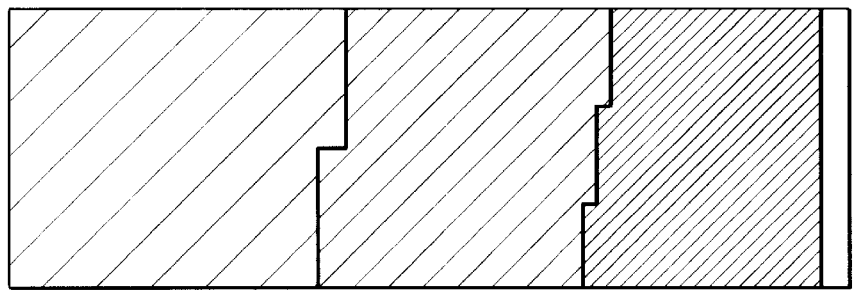
FIG. 3a is a top view schematic diagram of a ceramic surface which has large surface steps thereon.
Figure 3B:
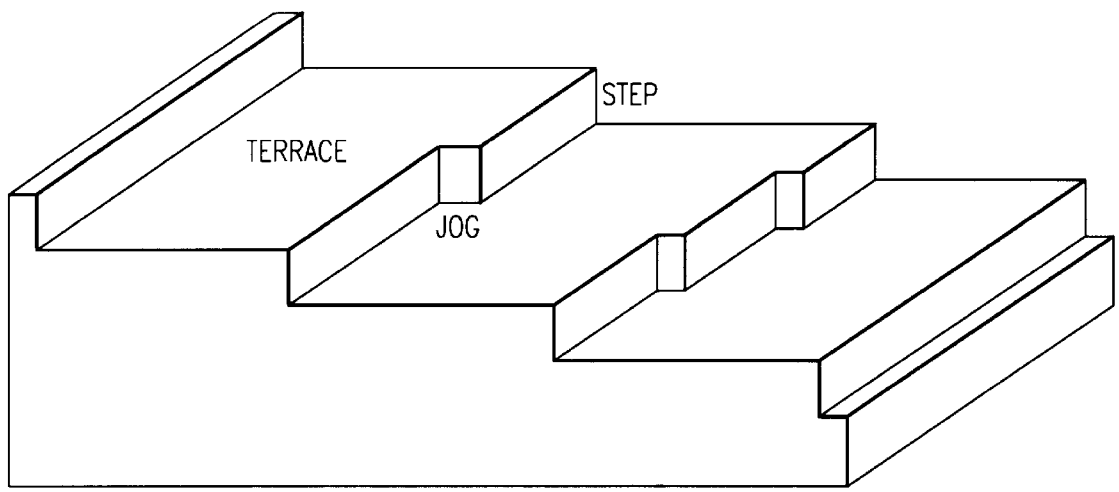

This invention shows that the surface can be tailored by precisely controlling the surface orientation and subsequent heat treatments to form large surface steps which will help align the islands and therefore reduce their misorientation. FIGS. 3a and 3b are schematic diagrams of a ceramic surface which has large surface steps thereon. This surface has faceted and formed three different types of features. Flat terraces cover most of the surface and are the nominal surface orientation. Faceted steps accommodate the misorientation away from the terrace orientation and are parallel to specific crystallographic planes. The step height can be controlled by the time and temperature of the heat treatment. Jogs accommodate misorientation between different surface steps and are also faceted along specific crystallographic planes. A partial list of ceramics where this type of surface structure has been shown to occur includes Y stabilized $ZrO_2 MgAl_2O_4$, $Al_2O_3$ (sapphire), 3C—SiC, 6H—SiC, and MgO (See Susnitzky, supra).

Figure 4:
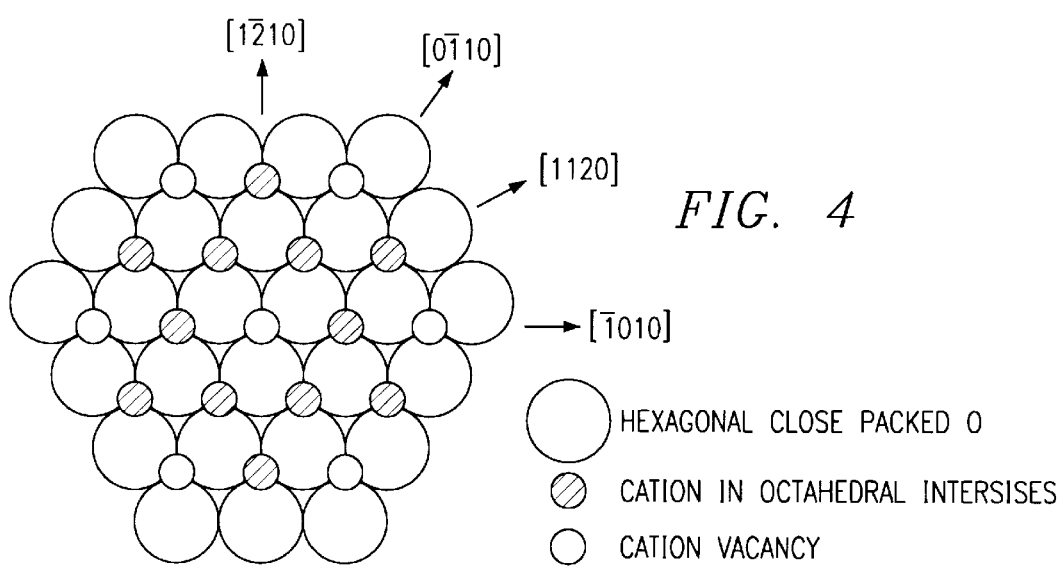
FIG. 4 is a diagram showing the relative atomic positions of the basal plane (0001) of sapphire.

FIG. 4 is a diagram showing the relative atomic positions of the basal plane (0001) of sapphire. The lattice parameter of sapphire is a=0.48 nm, c=13.0 nm. The two prism planes (1210) and (0110) are labeled and sapphire facets on the basal plane and the two prism planes. Therefore a surface oriented near the basal plane is observed to consist of flat basal plane terraces and steps and jogs parallel to the different prism planes.

Figure 5:
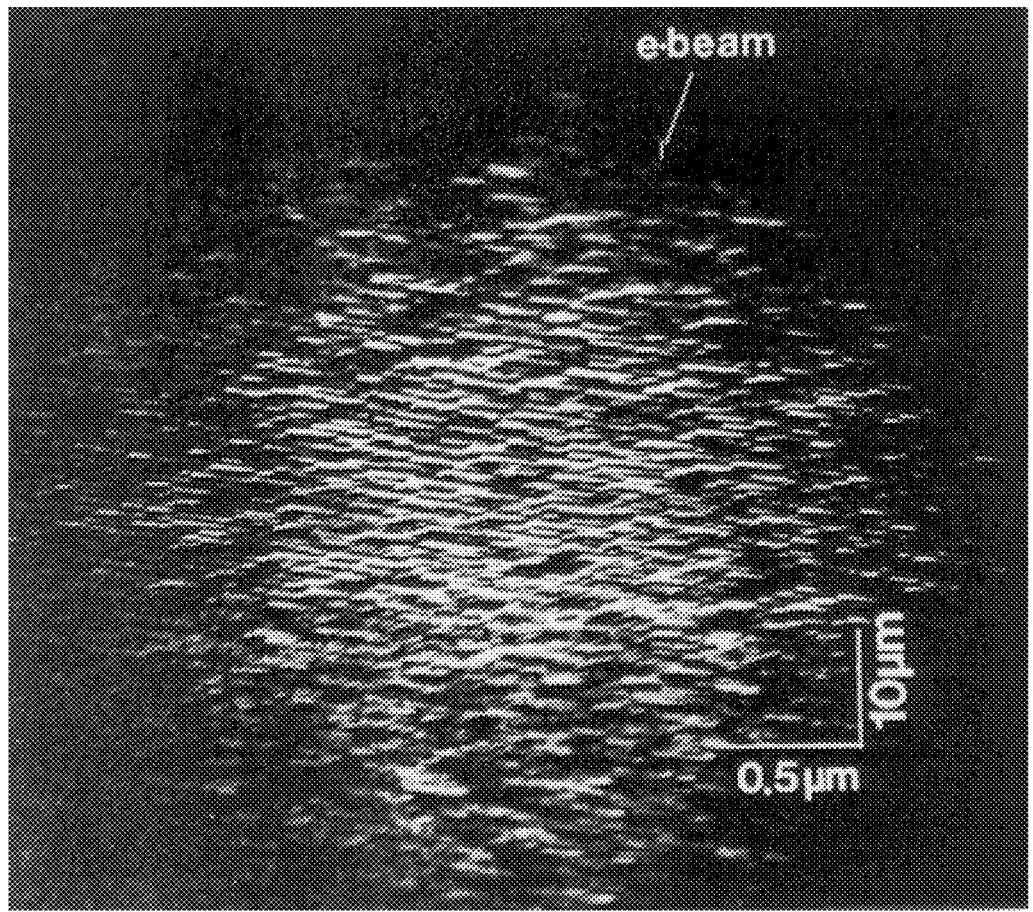
FIG. 5 is a dark-field reflection electron microscopy (REM) image of a basal plane oriented sample of sapphire.

FIG. 5 (FIG. 3 in Susnitzky 1986) is a dark-field reflection electron microscopy (REM) image of a basal plane oriented sample of sapphire. The surface steps are clearly visible and have been measured to be about 5 nm tall (about 4 unit cells in the c-direction). Notice that two types of steps are visible in this micrograph.

Figure 6:
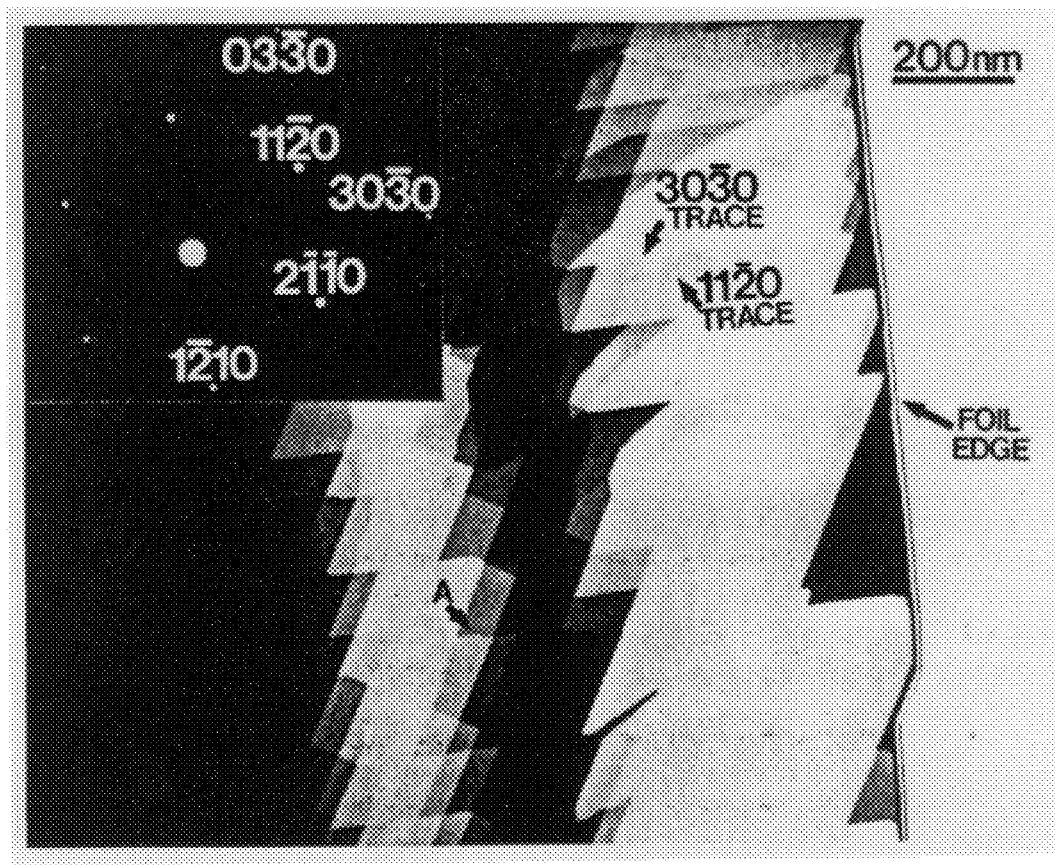
FIG. 6 is a bright-field (BF) transmission electron microscopy (TEM) image of sapphire oriented parallel to the basal plane.

FIG. 6 (FIG. 2 in Susnitzky 1986) is a bright-field (BF) transmission electron microscopy (TEM) image of sapphire oriented parallel to the basal plane. In the BF image, constant intensity corresponds to a constant thickness. Therefore, the regions of constant thickness are basal plane terraces and the lines where the contrast changes abruptly correspond to surface steps. The surface steps lie parallel to the two types of prism planes {1210} and {0110}.

Figure 7A:
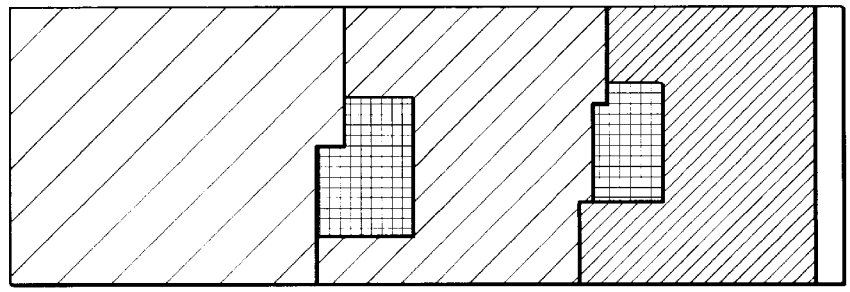
FIG. 7a is a top view schematic diagram of two islands which have grown on the surface shown in FIG. 3.
Figure 7B:
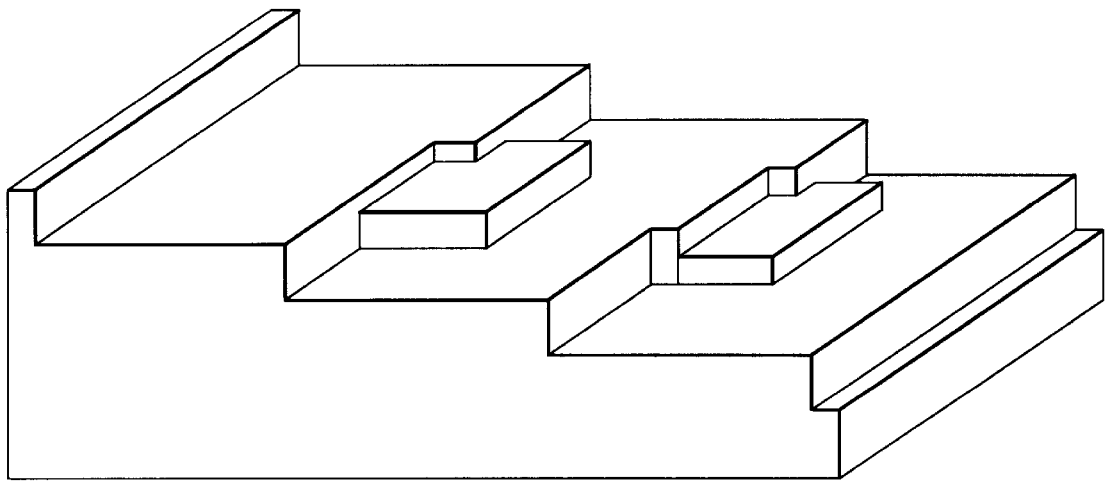

Growth on ceramic surfaces which have formed large surface steps has been studied and is illustrated in FIGS. 7a and 7b. FIGS. 7a and 7b are schematic diagrams of two islands which have grown on the surface shown in FIG. 3. This diagram illustrates some points which have been found in studying the growth of $Fe_2O_3$ and $Al_2O_3$ (see L. A. Tietz, Ph.D. Thesis, Cornell University (1989)) on $YBa_2Cu_3O_7$ on MgO (see M. G. Norton et al., "Observation of the Early Stages of Growth of Superconducting Thin Films by Transmission Electron Microscopy," *Appl. Phys. Lett.,* 55, pp. 2348–50 (1989)). The islands preferentially nucleate on steps and step jogs as shown in FIG. 7. Nucleation on terraces is much less likely. Islands in general grow more rapidly parallel to the steps rather than over the terraces.

Figure 8:
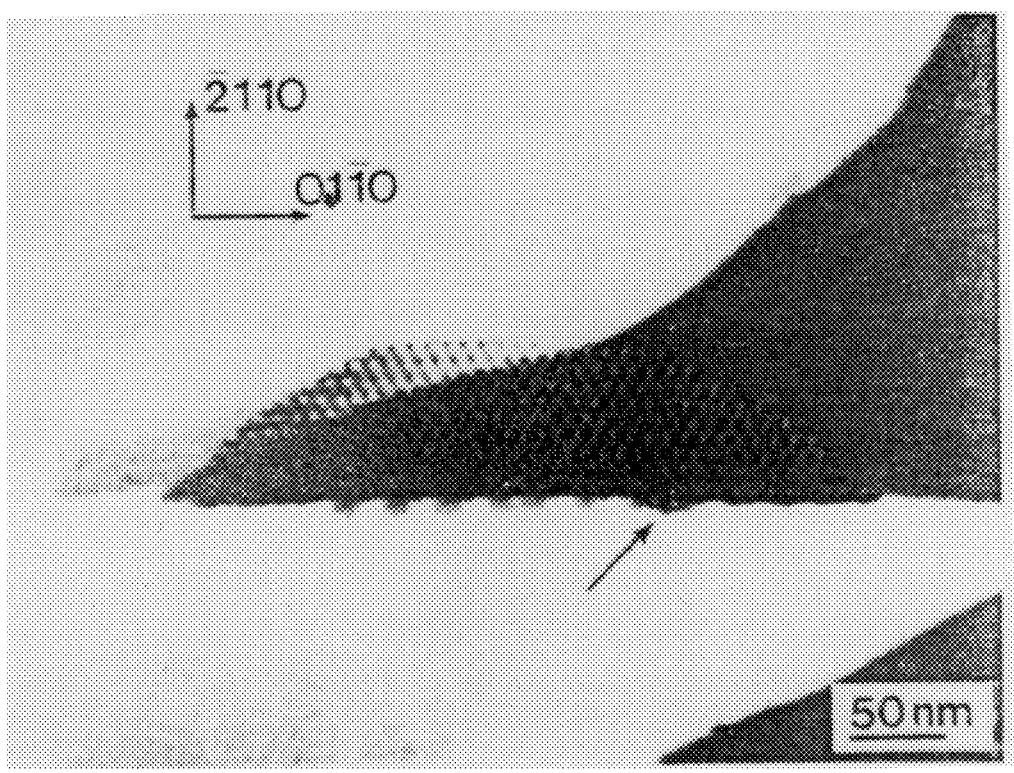
FIG. 8 is a BF image and selected area diffraction pattern showing the preferential nucleation and growth of a $Fe_2O_3$ island on basal plane sapphire.

FIG. 8 (FIG. 2 from L. A. Tietz et al., "Early Stages of the Heteroepitactic Growth of Hematite on (0001) $Al_2O_3$ by Transmission Electron Microscopy,"*Appl. Phys. Lett.,* 55, pp. 1202–4 (1989) is a BF image and selected area diffraction pattern showing the preferential nucleation and growth of a $Fe_2O_3$ island on basal plane sapphire. The island has nucleated on a step and has preferentially grown parallel to the step. The arrow illustrates where the island has started to grow over the step.

The islands which nucleate on the steps should have a much smaller misorientation compared to islands nucleating on the terraces since the steps should act to align the islands. It is therefore critically important to control the type, density and height of the steps. FIGS. 9a to 9c show that the angle from exact orientation can be used to control the step spacing for a given step height. Doubling the degree of misorientation halves the step spacing and therefore greatly reduces the probability of nucleating an island on the terrace rather than on the step.

Figure 9:
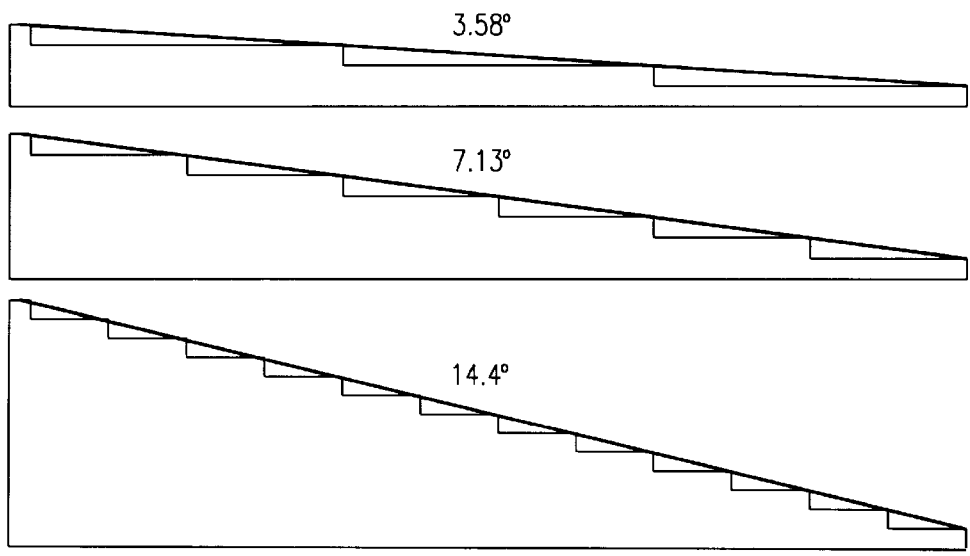
FIGS. 9a to 9c show that the angle from exact orientation can be used to control the step spacing for a given step height.
Figure 10:
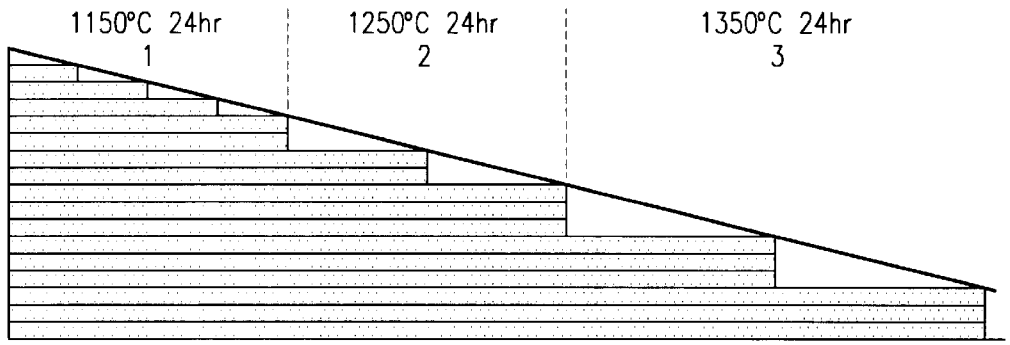
FIG. 10 illustrates how the substrate temperature for a given annealing time can be used to control the step height for basal plane sapphire.
Figure 11:
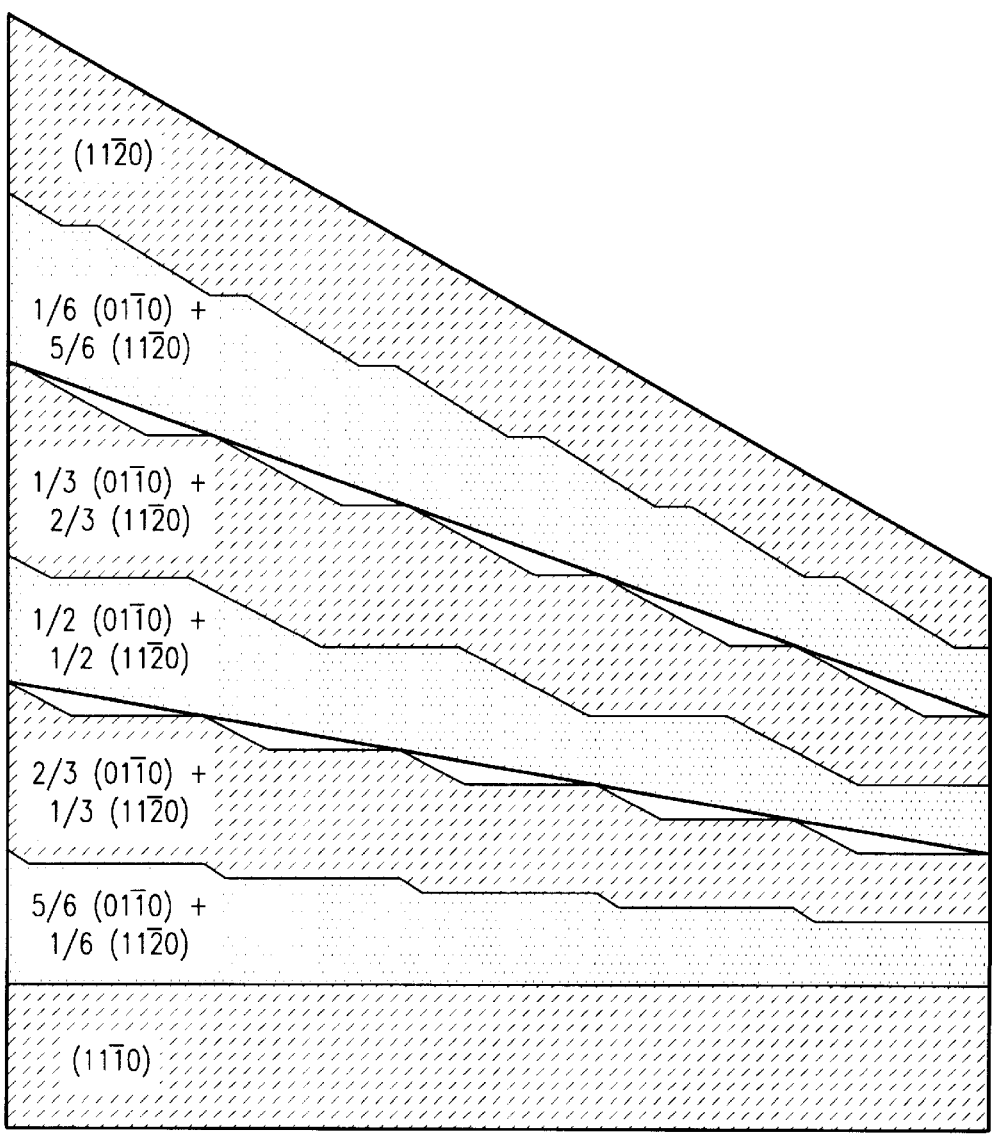
FIG. 11 shows that the direction in which the substrate is tilted is also important in controlling the surface structure.

FIG. 10 illustrates how the substrate temperature for a given annealing time can be used to control the step height for basal plane sapphire. The step height in sapphire has been shown to be in multiple unit cell high thicknesses. The temperatures are based upon the experimental data in the Susnitzky references. FIG. 11 shows that the direction in which the substrate is tilted is also important in controlling the surface structure. Basal plane sapphire forms surface steps parallel to {1210} and {0110} planes. FIG. 11 shows various orientations between these two directions. Although it has not been experimentally measured, the different surface steps are expected to have different nucleation probabilities. In addition the jogs are known to act as preferential sites for nucleation. Therefore, there should be differences in the microstructure and corresponding differences in the film quality between the different surface orientations which are shown in FIG. 11. FIGS. 9, 10 and 11 illustrate the different methods which can be used to control the surface structure and therefore improve the film quality. The redistribution of the atoms on the surface is by heating the substrate to at least 1200° C. for at least one hour, and the step of epitaxially growing a semiconductor on the substrate utilizes an initial epitaxy at a first temperature, then a second epitaxial growth of an additional thickness of a semiconductor is at a second temperature, where the second temperature is at least 100° C. higher than the first temperature.

By controlling the surface structure, higher quality material is grown on large misfit substrates which form the types of surfaces described above. The primary advantage is that new substrates which have better properties (price, properties, etc.) become available as substrates. The primary disadvantage is that forming this type of surface has generally required a high temperature heat treatment which implies that this step must be performed prior to most process steps. In addition, the orientation of the substrate is controlled fairly precisely (about 0.3°) in order to precisely control the surface structure.

The quality of Si grown on rhombohedral plane sapphire was improved by growing on off oriented sapphire which had been heated prior to growth to 1200° C. for 30 min. (R. T. Smith et al., "Influence of Sapphire Substrate Orientation on SOS Crystalline Quality and SOS/MOS Transistor Mobility",*Journal of Crystal Growth,* 58 (1982) pp. 61–72). One potential problem with using, surface steps to improve growth of (100) Si on rhombohedral sapphire is that surface steps form on {2110}, {1102}, and {0114}planes. The sapphire surface is only pseudo cubic and while two sets of the surface steps are orthogonal, one set is not. Knowledge of the surface steps is therefore another important piece of information in deciding what orientation and kind of heat treatment are important in improving defect density. The best quality GaN on basal plane sapphire also requires a high temperature 1050° C. heat treatment (Nakamura 1991 supra) prior to film growth. These authors stated that the heat treatment was necessary to "clean" the surface.

Surface steps are known to be important in the growth of 6H—SiC on 6H—SiC but for a different reason (see H. S. Kong et al., "Chemical Vapor Deposition and Characterization of 6H—SiC Thin Films on Off-Axis 6H—SiC Substrates," *J. Appl. Phys.,* 64, pp. 2672–79 (1988)). Chemical vapor deposition of 6H—SiC on 6H—SiC is difficult because of the formation of 3C—SiC. 3C—SiC is known to nucleate on basal plane terraces. 6H—SiC is known to nucleate and grow from step edges. It is therefore very important to grow on off-axis 6H—SiC substrates in order to prevent 3C—SiC from nucleating. They control the terrace width by controlling the misorientation, and obtain a small terrace width by a large off-axis orientation, which allows 6H—SiC growth at much lower temperatures. Growth of 6H—SiC on 6H—SiC is therefore entirely step controlled. Step controlled growth is therefore used in this situation to control polytype during homoepitaxy and not used to improve crystal quality in heteroepitaxy.

It is possible that this technique may be viable in a large number of systems such as Si on $MgAl_2O_4$ and GaN or AlN on sapphire in addition to the growth of SiC on sapphire. While most of the examples used sapphire as the substrate, many substrates form surface steps as noted and this technique can be used to improve heteroepitaxy with any substrate which forms large surface steps. Sapphire is a very popular substrate because of its availability, cost and properties.

In a preferred embodiment, a sapphire wafer is cut and polished to a predetermined angle off the C-axis, this angle being 5 degrees in the preferred embodiment. The wafer is then annealed to form the desired surface step structure, this being at, for example, 1300° C. for 24 hours to obtain steps in the 26 to 39 angstrom range. Aluminum nitride is then deposited on the sapphire wafer by chemical vapor deposition (CVD) to a thickness of about 200 angstroms and sufficient to provide complete coverage of the sapphire wafer with the aluminum nitride at a low temperature in the range of 700 to 800° C. The low temperature enhances the nucleation rate. The temperature will be sufficiently elevated so that island nucleation takes place on the steps in the sapphire and not on the terraces. The wafer with aluminum nitride thereon is then annealed in a nitrogen ambient at about 1100° C. for about 2 hours. The anneal allows all neighboring steps to anneal out any damage and improve quality. Since the sapphire steps are very thin, any damage is easily annealed out. Then a thick layer of aluminum nitride is deposited by CVD at about 1100° C. to about 1micron total thickness as a buffer layer to remove dislocations and provide a very high quality top surface. Then the silicon carbide is grown by CVD. The type of silicon carbide deposited will depend upon the type of device desired (i.e., p-type, n-type, etc.). The final silicon carbide layer thickness is about 0.3 micron, again depending upon the type of device desired. The devices formed in the silicon carbide will be similar to those formed in silicon-on-sapphire and in silicon-on-insulator devices. It may be necessary to form a silicon carbide-aluminum nitride alloy nucleation layer over the aluminum nitride and under the silicon carbide layers. It is also contemplated that the semiconductor layer can be formed from an alloy of aluminum nitride and silicon carbide for the purpose of bandgap adjustment of the semiconductor material wherein the two materials are simultaneously deposited by CVD from, for example, silicon tetrachloride and propane for silicon carbide and tripropyl aluminum and ammonia for the aluminum nitride. Silicon carbide further uses aluminum and nitrogen as its p-type and n-type dopants, thereby permitting doping using the same chemicals as required for layer formation.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. A method for heteroepitaxial growth, said method comprising the steps of:

(a) cutting and polishing a single crystal ceramic substrate at from about 1 to about 10 degrees off axis to produce a substantially flat surface;

(b) redistributing atoms on said surface to produce surface steps of at least three lattice spacings by heating said substrate to at least 1200° C. for at least 1 hour; and (c) then growing a layer of semiconductor over said substrate, wherein the method includes the step of epitaxially growing a ceramic buffer layer on said substrate prior to step (c).

2. The method of claim 1, wherein said substrate is selected from the group consisting of Y stabilized zirconia, $MgAl_2O_4$, $Al_2O_3$, 3C—SiC, 6H—SiC and MgO.

3. The method of claim 1, wherein said substrate is selected from the group consisting of Y stabilized zirconia, $MgAl_2O_4$, $Al_2O_3$, 3C—SiC, 6H—SiC and MgO.

4. The method of claim 1, wherein said ceramic buffer layer is one of AlN or GaN.

5. The method of claim 4, wherein said ceramic buffer layer is one of AlN or GaN.

6. The method of claim 1 wherein said semiconductor is one of SiC, AlN or GaN.

7. The method of claim 1 wherein said semiconductor is one of SiC, AlN or GaN.

8. The method of claim 3 wherein said semiconductor is one of SiC, AlN or GaN.

9. The method of claim 4 wherein said semiconductor is one of SiC, AlN or GaN.

10. The method of claim 5 wherein said semiconductor is one of SiC or GaN.

11. The method of claim 6 wherein said semiconductor is one of SiC or GaN.

12. The method of claim 1, wherein said step of epitaxially growing a semiconductor on said substrate comprises the steps of providing an initial epitaxial growth at a first temperature, then providing a second epitaxial growth and additional thickness of said semiconductor at a second temperature, where said second temperature is at least 100° C. higher than said first temperature.

13. The method of claim 1 wherein said step of eptiaxially growing a semiconductor on said substrate comprises the steps of providing an initial epitaxial growth at a first temperature, then providing a second epitaxial growth an additional thickness of said semiconductor at a second temperature, where said second temperature is at least 100° C. higher than said first temperature.

* * * * *